US006864518B1

(12) United States Patent
Longway et al.

(10) Patent No.: US 6,864,518 B1
(45) Date of Patent: Mar. 8, 2005

(54) BIT CELLS HAVING OFFSET CONTACTS IN A MEMORY ARRAY

(75) Inventors: Charles Longway, Las Flores, CA (US); Charlie Yu, Irvine, CA (US); Gurvinder Jolly, Laguna Niguel, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 10/438,664

(22) Filed: May 14, 2003

(51) Int. Cl.$^7$ .............................................. H01L 27/10
(52) U.S. Cl. ...................... 257/202; 257/204; 257/206; 257/208; 257/209; 257/211
(58) Field of Search ................................. 257/393, 394, 257/903, 902; 365/149, 150, 151

(56) References Cited

U.S. PATENT DOCUMENTS 6,137,713 A * 10/2000 Kuroda et al. .............. 365/149

* cited by examiner

Primary Examiner—Nathan J. Flynn
Assistant Examiner—Fazli Erdem
(74) Attorney, Agent, or Firm—Farjami & Farjami LLP

(57) ABSTRACT

According to one exemplary embodiment, a semiconductor data array comprises an active segment situated on a substrate. The semiconductor data array can be, for example, a ROM array. The semiconductor data array further comprises a first word line situated over the active segment and a second word line situated substantially parallel to the first word line, where the second word line is not situated over the active segment. The semiconductor data array further comprises a column situated over the active segment, the first word line, and the second word line. The semiconductor data array further comprises a contact situated on the active segment, where the contact couples the active segment to the column, where the contact is separated from the first word line by a first distance and from the second word line by a second distance, and where the first distance is less than the second distance.

20 Claims, 5 Drawing Sheets

FIG. 4

BIT CELLS HAVING OFFSET CONTACTS IN A MEMORY ARRAY

BACKGROUND OF THE INVENTION

1. Field of the Invention

The present invention is generally in the field of fabrication of semiconductor devices. More specifically, the present invention is in the field of fabrication of semiconductor memory arrays.

2. Background Art

Semiconductor data arrays, such as read-only-memory ("ROM") arrays, include bit cells, which are arranged in rows and columns. In a ROM array, for example, the bit cells can be situated between active lines, which form a ground bus. The bit cells, which can comprise two-bit stacks, can be accessed by word lines and columns. The size of the ROM array is determined by the size of the bit cells within the ROM array. Thus, in order to satisfy an increasing demand for reduced-size semiconductor devices that include semiconductor data arrays, such as ROM arrays, semiconductor manufacturers are challenged to reduce the size of the bit cells within these arrays.

The size of the bit cells in a typical semiconductor data array, such as a ROM array, is determined by dimensions such as active line width, word line width, contact width, and spacing between active and word lines and contacts. However, since these dimensions in current bit cells are generally close to minimum dimensions allowable by design rules, it is difficult to decrease bit cell size.

Additionally, it is desirable to increase speed, manufacturing yield, and/or manufacturing robustness of bit cells in semiconductor data arrays, such as ROM arrays.

Thus, there is need in the art for a bit cell having reduced size in a semiconductor data array, such as a ROM array. There is further need in the art for a bit cell having increased speed and manufacturing yield.

SUMMARY OF THE INVENTION

The present invention is directed to bit cells having offset contacts in a memory array. The present invention addresses and resolves the need in the art for a bit cell having a reduced size in a semiconductor data array, such as a ROM array, while providing increased speed and manufacturing yield.

According to one exemplary embodiment, a semiconductor data array comprises an active segment situated on a substrate. The semiconductor data array can be, for example, a ROM array. The semiconductor data array further comprises a first word line situated over the active segment. The semiconductor data array further comprises a second word line situated substantially parallel to the first word line, where the second word line is not situated over the active segment. The semiconductor data array further comprises a column situated over the active segment, the first word line, and the second word line.

According to this exemplary embodiment, the semiconductor data array further comprises a contact situated on the active segment, where the contact couples the active segment to the column, where the contact is separated from the first word line by a first distance and from the second word line by a second distance, and where the first distance is less than the second distance. The active segment can overlay the contact by, for example, a third distance, where the third distance is substantially equal to a minimum design rule separation distance. The first distance can be, for example, substantially equal to a minimum design rule distance. The contact can be situated in a bit cell, where the bit cell has a height substantially equal to a minimum design rule height.

According to this exemplary embodiment, the semiconductor data array can further comprise an active line, where the active line is situated substantially parallel to the first word line, and where the active line is connected to the active segment. The active line can have a width that is substantially equal to a minimum design rule width, for example. The semiconductor data array can further comprise a transistor, where the transistor is situated at an intersection of the first word line and the active segment. Other features and advantages of the present invention will become more readily apparent to those of ordinary skill in the art after reviewing the following detailed description and accompanying drawings.

BRIEF DESCRIPTION OF THE DRAWINGS

FIG. 4 illustrates a top view of an exemplary structure including exemplary bit cells, in accordance with one embodiment of the present invention.

DETAILED DESCRIPTION OF THE INVENTION

The present invention is directed to bit cells having offset contacts in a memory array. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
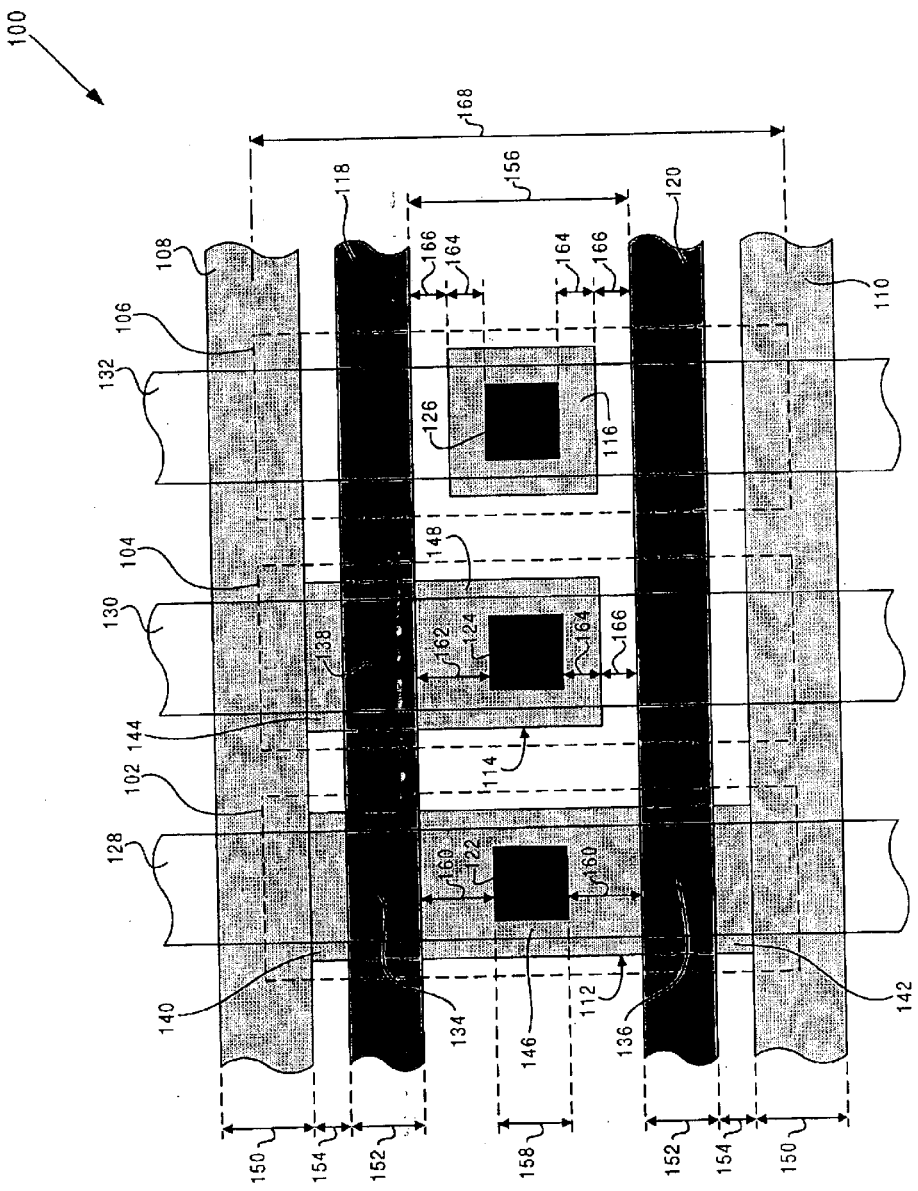
FIG. 1 illustrates a top view of an exemplary structure including conventional exemplary bit cells.

FIG. 1 shows a top view of exemplary structure including conventional exemplary bit cells. Structure 100 can be, for example, a semiconductor data array, such as a ROM array. Structure 100 includes bit cells 102, 104, and 106, active lines 108 and 110, active segments 112, 114, and 116, word lines 118 and 120, contacts 122, 124, and 126, and columns 128, 130, and 132. Bit cell 102 includes transistors 134 and 136 and bit cell 104 includes transistor 138. Bit cells 102, 104, and 106 can be, for example, ROM bit cells.

Each bit cell in structure 100 is capable of being programmed with two bits of data and, consequently, each bit cell in data array 100 can comprise one of four possible data configurations, e.g., "00", "10", "01", or "11". As a convention in the present application, "0" indicates the presence of a transistor in a bit cell and "1" indicates the absence of a transistor in a bit cell. In FIG. 1, bit cell 102, which comprises transistors 134 and 136, represent a "00" data configuration, bit cell 106, which comprises no transistors, represents a "11" data configuration, and bit cell 104, which comprises one transistor, represents "10" and "01" date configurations.

As shown in FIG. 1, active lines 108 and 110 are situated in a substrate, which is not shown in FIG. 1, and are substantially parallel to each other. Active lines 108 and 110 each form a portion of a ground bus and each have width 150, which can be substantially equal to a minimum design rule width. Also shown in FIG. 1 active segment 112 is connected to active lines 108 and 110 and active segment 114 is connected to active line 108. Further shown in FIG. 1, word line 118 is situated over active segments 112 and 114 and is substantially parallel to active line 108. Word line 118 can comprise a conductive material, such as polycrystalline silicon ("poly"), or even a semiconductor material, and has width 152, which can be substantially equal to a minimum design rule width.

Also shown in FIG. 1, word line 120 is situated over active segment 112 and is substantially parallel to word line 118 and active line 110. Word line 120 can comprise similar materials as word line 118 and has width 152. Word lines 118 and 120 are separated from active lines 108 and 110, respectively, by distance 154, which can be a minimum design rule separation distance. Word lines 118 and 120 are separated from each other by distance 156. Further shown in FIG. 1, transistors 134 and 136 are situated in bit cell 102 and are formed at the intersection of active segment 112 and word lines 118 and 120, respectively. As shown in FIG. 1, source regions 140 and 142 of transistors 134 and 136 are connected to active lines 108 and 110, respectively. Also shown in FIG. 1, transistor 138 is situated in bit cell 104 and is formed at the intersection of word line 118 and active segment 114 and source region 144 of transistor 138 is connected to active line 108.

Further shown in FIG. 1, active segment 116 is situated in bit cell 106 between word lines 118 and 120. Also shown in FIG. 1, columns 128, 130, and 132 are situated over and substantially perpendicular tb word lines 118 and 120 and can comprise metal. Further shown in FIG. 1, contacts 122, 124, and 126 are situated over active segments 112, 114, and 116 respectively. Contact 122 couples drain region 146, which is shared between transistors 134 and 136, to column 128, contact 124 couples drain region 148 of transistor 138 to column 130, and contact 126 couples active segment 116 to column 132. Contacts 122, 124, and 126 each have width 158, which can be substantially equal to a minimum design rule width.

Contact 122 is separated from word lines 118 and 120 by distance 160, contact 124 is separated from word line 1.18 by distance 162 and from word line 120 by distances 164 and 166, and contact 126 is separated from word line 118 and word line 120 by distances 164 and 166, which can be substantially equal to minimum design rule distances. Since contacts 122, 124, and 126 are each situated an equal distance from word lines 118 and 120, the sum of distances 164 and 166 must be equal to distance 162. In structure 100, active line pitch 168, which is equal to the distance between the center of active line 108 and the center of active line 110, is determined by the largest of the minimum design rule heights of bit cells 128, 130, and 132. Since distance 160 is less than the sum of distance 164 and distance 166, the height of bit cell 130 determines active line pitch 168 in structure 100. By way of example, active line pitch 168 can be approximately 1.18 microns.

Figure 2:
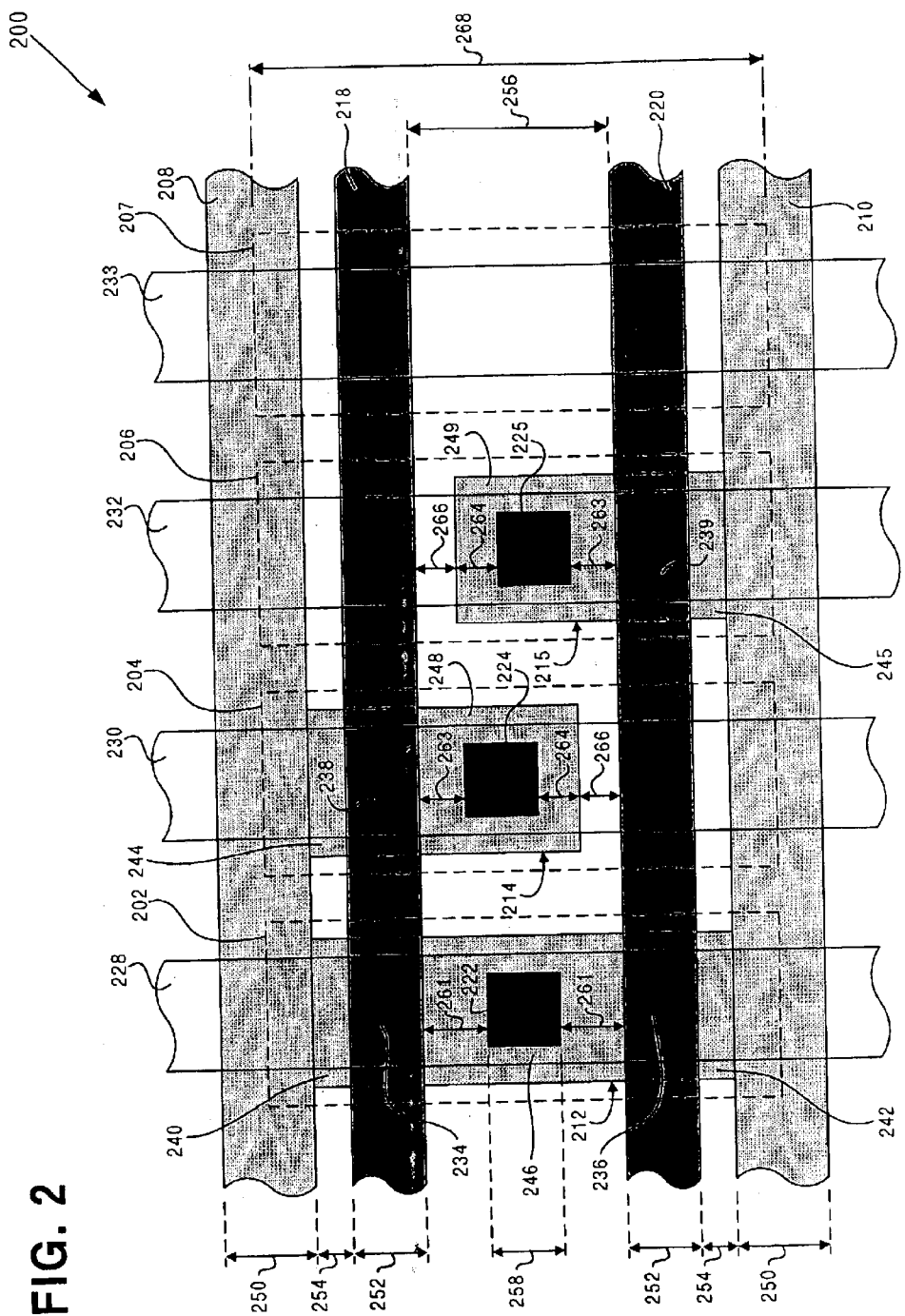
FIG. 2 illustrates a top view of an exemplary structure including exemplary bit cells, in accordance with one embodiment of the present invention.

FIG. 2 shows a top view of an exemplary structure including exemplary bit cells in accordance with one embodiment of the present invention. Structure 200 can be a semiconductor device comprising a ROM array. However, the present invention can be applied to other semiconductor data arrays, such as gate arrays. Structure 200 includes bit cells 202, 204, 206, and 207, word lines 208 and 210, active segments 212, 214, and 215, word lines 218 and 220, contacts 222, 224, and 225, and columns 228, 230, 232, and 233. Bit cell 202 includes transistors 234 and 236, bit cell 204 includes transistor 238, and bit cell 206 includes transistor 239. Bit cells 202, 204, 206, and 207 can be, for example, ROM bit cells.

Each bit cell in structure 200 is capable of being programmed with two bits of data and, consequently, each bit cell in data array 200 can comprise one of four possible data configurations, e.g., "00", "10", "01", or "11". Bit cell 202, which comprises transistors 234 and 236, represents a "00" data configuration, bit cell 204, which comprises transistor 238, represents a "10" data configuration, bit cell 206, which comprises transistor 239, represents a "01" data configuration, and bit cell 207, which comprises no transistors, represents a "11" data configuration.

As shown in FIG. 2, active lines 208 and 210, which correspond to active lines 108 and 110 in FIG. 1, are situated in a substrate, which is not shown in FIG. 2, and are substantially parallel to each other. Active lines 208 and 210 each have width 250, which can be substantially equal to a minimum design rule width, and active lines 208 and 210 each comprise a ground bus. Also shown in FIG. 2, active segment 212 is situated between and connected to active lines 208 and 210, active segment 214 is situated adjacent to active segment 212 and connected to active line 208, and active segment 215 is situated adjacent to active segment 214 and connected to active line 210.

Further shown in FIG. 2, word line 218 is situated over active segments 212 and 214 and is substantially parallel to active line 208. Also shown in FIG. 2, word line 220 is situated over active segments 212 and 215 and is substantially parallel to active line 210. Word line lines 218 and 220 can comprise a conductive material, such as poly, or even a semiconductor material, and have width 252, which can be substantially equal to a minimum design rule width. Word lines 218 and 220 are separated from active lines 208 and 210, respectively, by distance 254, which can be substantially equal to a minimum design rule separation distance, and word line 218 is separated from word line 220 by distance 256.

Further shown in FIG. 2, transistors 234 and 236 are situated in bit cell 202 at the intersection of active segment 212 and word lines 218 and 220, respectively. Source regions 240 and 242 of transistors 234 and 236 are connected to active lines 208 and 210, respectively. Also shown in FIG. 2, transistor 238 is situated in bit cell 204 at the intersection of word line 218 and active segment 214 and transistor 239 is situated in bit cell 206 at the intersection of word line 220 and active segment 215. Source regions 244 and 245 of transistors 238 and 239 are connected to active lines 208 and 210, respectively. Further shown in FIG. 2, columns 228, 230, 232, and 233 are situated over and substantially perpendicular to word lines 218 and 220. Columns 228, 230, 232, and 233 can comprise metal and can be situated in metal level one, two, or a higher metal level of a semiconductor die.

Also shown in FIG. 2, contacts 222, 224, and 225 are situated over active segments 212, 214, and 215, respectively. In the present application, contacts 224 and 225 are also referred to as "offset contacts." Contact 222 couples drain region 246, which is a drain region shared by transistors 234 and 236, to column 228, contact 224 couples drain region 248 of transistor 238 to column 230, and contact 225 couples drain region 249 of transistor 239 to column 232. Contacts 222, 224, and 225 have width 258, which can be substantially equal to a minimum design rule width. Contact 222 is separated from word lines 218 and 220 by distance 261, contact 224 is separated from word line 218 by distance 263, which can be substantially equal to a minimum design rule separation distance. Active segment 214 overlaps contact 224 by distance 264, which can be substantially equal to a minimum design rule overlap distance. Active segment 214 is separated from word line 220 by distance 266, which can be substantially equal to a minimum design rule separation distance. Thus, contact 224 is separated from word line 220 by the sum of distances 264 and 266. Contact 225 is separated from word line 218 by the sum of distances 264 and 266 and from word line 220 by distance 263.

In structure 200, a minimum design rule size of active line pitch 268 is determined by the largest of the minimum design rule heights of bit cells 202, 204, 206, and 207. The minimum design rule size of distance 261 in bit cell 202 is equal to the minimum design rule size of distance 263 in bit cells 204 and 206. However, the minimum design rule size of distance 261 is less than the minimum design rule size of the sum of distances 264 and 266 in bit cells 204 and 206. Thus, the minimum design rule height of bit cell 202 is less than the minimum design rule height of bit cell 204 or bit cell 206. Also, since the minimum design rule size of space 256, which determines the minimum design rule height of bit cell 207, is less that two times the minimum design rule size of distance 261 plus width 258, the minimum design rule height of bit cell 207 is less than the minimum design rule height of bit cell 202. Thus, the heights of bit cells 204 and 206 determine the minimum design rule size of active line pitch 268. By way of example, the minimum design rule size of active line pitch 268 can be approximately 1.14 microns.

Since contacts 224 and 225 in bit cells, 204 and 206, respectively, are offset, the minimum design rule size of distance 263 is less than the sum of distances 264 and 266. Thus, since distances 264 and 266 correspond to respective distances 164 and 166 in conventional bit cell 104 in FIG. 1, the minimum design rule size of bit cells 204 and 206 is less than the minimum design rule size of bit cell 104. As a result, by utilizing offset bit cells for "10" and "01" data configurations, the present invention achieves a minimum active line pitch that can be less than the minimum allowable active line pitch of conventional structure 100 in FIG. 1. Consequently, the present invention achieves a bit cell that can have a minimum design rule height that is less than a minimum design rule height of a conventional bit cell. As a result, columns 228, 230, 232, and 233 in structure 200 can have a reduced size compared to columns 128, 130, and 132 in structure 100, which allows the present invention to advantageously achieve a bit cell having reduced area, increased speed, and reduced power as a result of reduced parasitic capacitance compared to a conventional bit cell. As a result, the present invention can achieve a semiconductor data array, such as a ROM array, having increased manufacturing yield compared to a conventional semiconductor data array. For example, the present invention can achieve an approximate 3.4 percent decrease in column reduction in column height and semiconductor die size, which results in an approximate 3.0 percent improvement in yield compared to a structure, such as structure 100, utilizing conventional bit cells having centered contacts.

Figure 3:
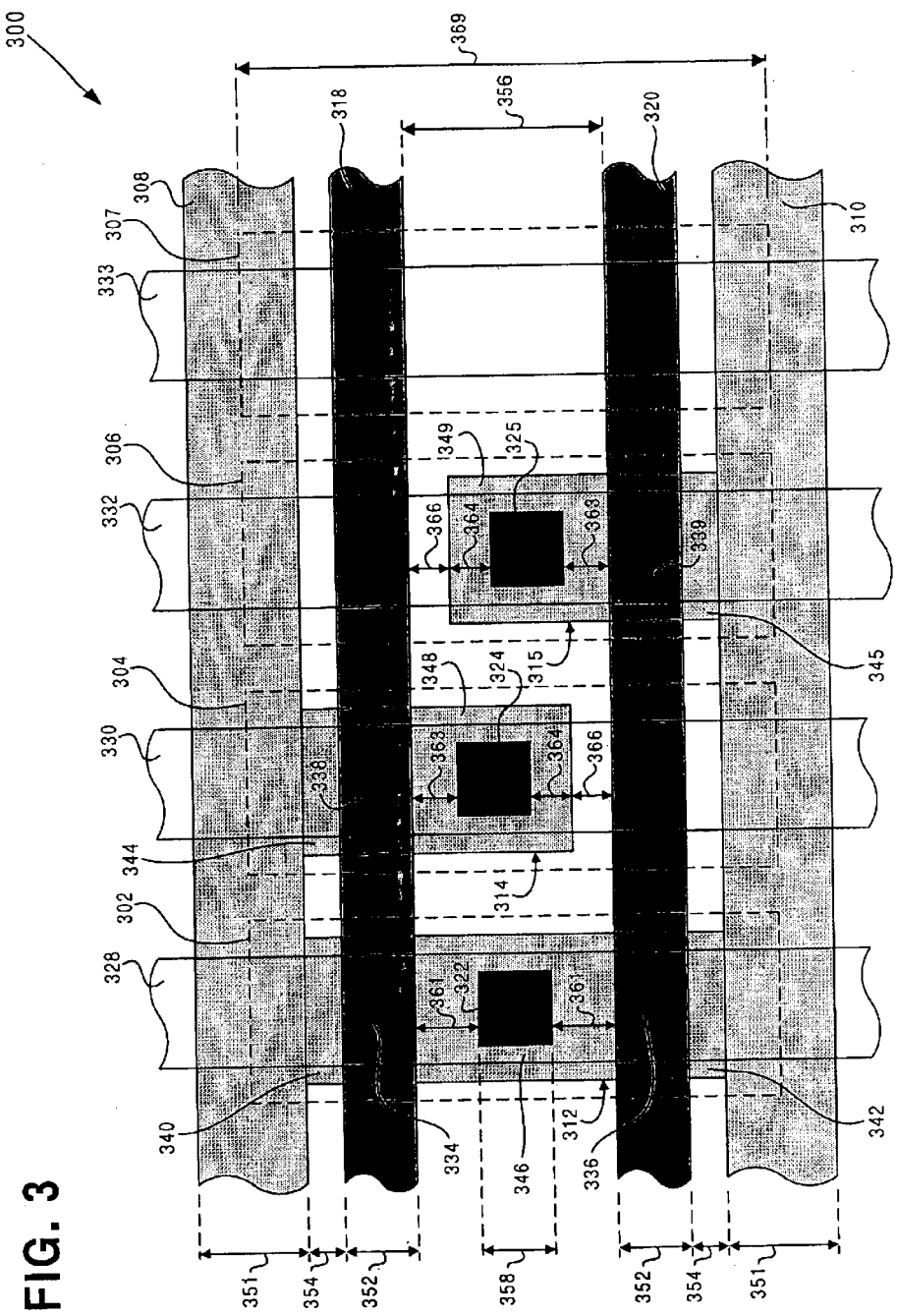
FIG. 3 illustrates a top view of an exemplary structure including exemplary bit cells, in accordance with one embodiment of the present invention.

FIG. 3 shows a top view of an exemplary structure including exemplary bit cells in accordance with one embodiment of the present invention. Similar to structure 200 in FIG. 2, structure 300 can be a portion of semiconductor data array, such as a ROM array, and can be situated in a semiconductor device. In structure 300, bit cells 302, 304, 306, and 307, active lines 308 and 310, active segments 312, 314, and 315, word lines 318 and 320, contacts 322, 324, and 325, columns 328, 330, 332, and 333, transistors 334, 336, 338, and 339, source regions 340, 342, 344, and 345, drain regions 346, 348, and 349, widths 352 and 358, and distances 354, 356, 361, 363, 364, and 366 correspond, respectively, to bit cells 202, 204, 206, and 207, active lines 208 and 210, active segments 212, 214, and 215, word lines 218 and 220, contacts 222, 224, and 225, columns 228, 230, 232, and 233, transistors 234, 236, 238, and 239, source regions 240, 242, 244, and 245, drain regions 246, 248, and 249, widths 252 and 258, and distances 254, 256, 261, 263, 264, and 266 in structure 200 in FIG. 2.

In structure 300, offset contacts, i.e. contacts 324 and 325, are utilized in a similar manner as in structure 200 discussed above to achieve a reduction in distance 356 between word lines 318 and 320 in contrast to distance 156 between word lines 118 and 120 in conventional structure 100. However, instead of utilizing the space saved by the present invention to decrease active line pitch 369, the spaced saved by the present invention in structure 300 is utilized to increase width 351 of active lines 308 and 310 such that width 351 is greater than a minimum design rule width. Thus, in structure 300, active line pitch 369 is substantially equal to active line pitch 168 in conventional structure 100. However, width 351 of active lines 308 and 310 is greater than width 150 of active lines 108 and 110 in conventional structure 100. Since active lines 308 and 310 comprise a ground bus, the present invention achieves a wider ground, bus, which has a lower resistance to ground, in contrast to a ground bus comprising active lines 108 and 110 in conventional structure 100. Thus, by achieving a wider ground bus, the embodiment of the present invention in FIG. 3 advantageously achieves a semiconductor date array, such as a ROM array, having increased speed, higher manufacturing yield, and improved manufacturing robustness.

Figure 4:
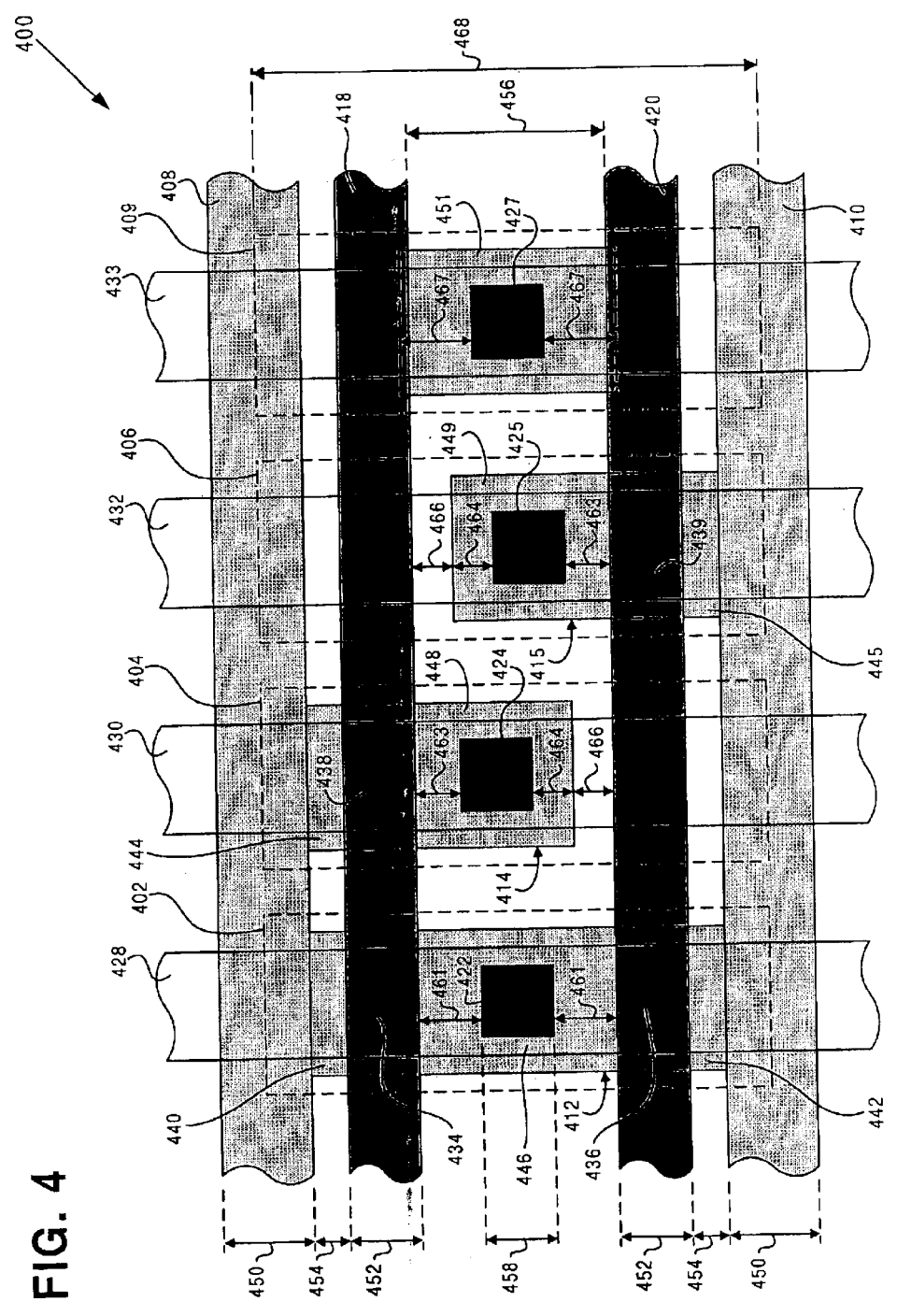

FIG. 4 shows a top view of an exemplary structure including exemplary bit cells in accordance with one embodiment of the present invention. Structure 400 can be a portion of semiconductor data array, such as a ROM array, and can be situated in a semiconductor device. In structure 400, bit cells 402, 404, and 406, active lines 408 and 410, active segments 412, 414, and 415, word lines 418 and 420, contacts 422, 424, and 425, columns 428, 430, 432, and 433, transistors 434, 436, 438, and 439, source regions 440, 442, 444, and 445, drain regions 446, 448, and 449, widths 450, 452, and 458, distances 454, 456, 461, 463, 464, and 466, and active line pitch 468 correspond, respectively, to bit cells 202, 204, and 206, active lines 208 and 210, active segments 212, 214, and 215, word lines 218 and 220, contacts 222, 224, and 225, columns 228, 230, 232, and 233, transistors 234, 236, 238, and 239, source regions 240, 242, 244, and 245, drain regions 246, 248, and 249, widths 250, 252 and 258, distances 254, 256, 261, 263, 264, and 266, and active line pitch 268 in structure 200 in FIG. 2.

As shown in FIG. 4, bit cell 409, which comprises a "11" data configuration, includes contact 427 and active segment 451. Contact 427 is situated over active segment 451 and situated an equal distance from word line 418 and word line 420. Active segment 451 overlaps contact 427 by distance 467. Since distance 467 is greater than the distance from contact 427 to word line 418 or word line 420, the ends of active segment 451 overlap respective word lines 418 and 420 a short distance. In the present embodiment, active segment 451 has a significantly larger size than a minimum design rule size, which substantially reduces the risk of photoresist breaking off and causing a short or other defect during formation of active segment 451. By utilizing active segment 451 and contact 427 in bit cell 409, the embodiment of the present invention in FIG. 4 achieves a bit cell having a "11" data configuration that allows coding changes to be more easily accomplished, as well as similar advantages discussed above in relation to the embodiment of the present invention in FIG. 2.

In one embodiment, bit cells 404 and 406 can be reduced in size by reducing distance 464 to less than a minimum design rule overlap distance such that distance 463 is equal to the sum of distance 464 and 466. As a result, contacts 424 and 425 are centered in bit cells 404 and 406, respectively. In such embodiment, bit cells 404 and 406 can be advantageously reprogrammed by changing the active layer, which comprises active segments 414 and 415, respectively, while not having to change contacts 424 and 425.

Figure 5:
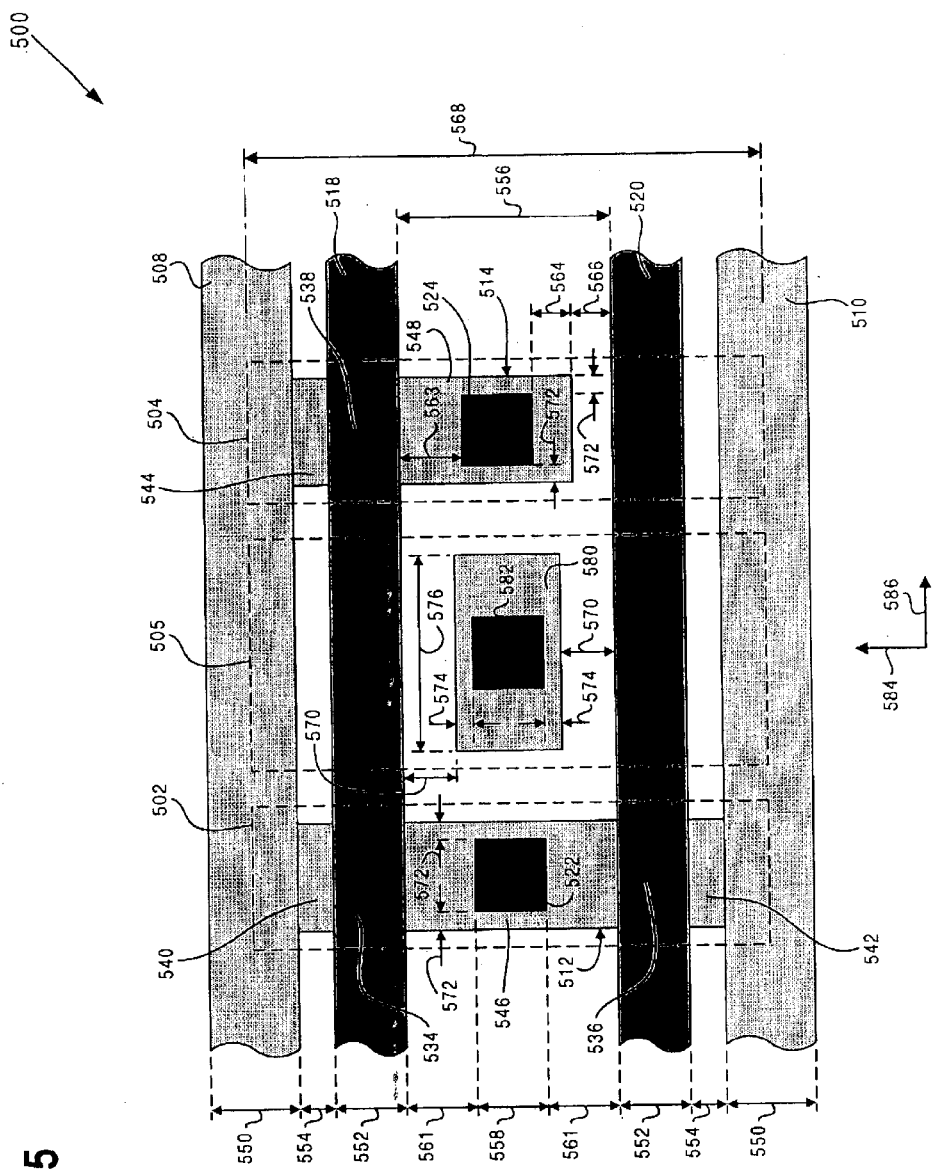
FIG. 5 illustrates a top view of an exemplary structure including exemplary bit cells, in accordance with one embodiment of the present invention.

FIG. 5 shows a top view of an exemplary structure including exemplary bit cells in accordance with one embodiment of the present invention. Structure 500 can be a portion of semiconductor data array, such as a ROM array, and can be situated in a semiconductor device. In structure 500, bit cells 502 and 504, active lines 508 and 510, active segments 512 and 514, word lines 518 and 520, contacts 522 and 524, transistors 534, 536, and 538, source regions 540, 542, and 544, drain regions 546 and 548, widths 550, 552, and 558, distances 554, 556, 561, 563, 564, and 566, and active line pitch 568 correspond, respectively, to bit cells 202 and 204, active lines 208 and 210, active segments 212 and 214, word lines 218 and 220, contacts 222 and 224, transistors 234, 236, and 238, source regions 240, 242, and 244, drain regions 246 and 248, widths 250, 252, and 258, distances 254, 256, 261, 263, 264, and 266, and active line pitch 268 in structure 200 in FIG. 2. It is noted that columns, such as columns 228, 230, and 233 in FIG. 2, are not shown over bit cells 502, 504, and 505 in FIG. 5 so as to more clearly illustrate the embodiment of the present invention in FIG. 5.

As shown in FIG. 5, bit cell 505, which comprises a "11" data configuration, includes contact 582 and active segment 580. Contact 582 is situated over active segment 580 and is separated from word line 5;18 and word line 520 by the sum of distances 570 and 574. Active segment 580 forms a rectangle having a larger width in the x-direction (indicated by arrow 586) than in the y-direction (indicated by arrow 584). Width 576 is chosen such that active segment 580 has a sufficiently large size such that the risk of photoresist breaking off and causing a short or other defect during formation of active segment 580 is significantly reduced. However, in order to accommodate the width of active segment 580 in the x-direction (indicated by arrow 586), overlap distance 572, which is the distance that active segment 512 overlaps contact 522 and active segment 514 overlaps contact 524 in the x-direction, must be less than a minimum design rule overlap distance.

By utilizing active segment 580 and contact 582 in bit cell 505, the embodiment of the present invention in FIG. 5 achieves a bit cell having a "11" data configuration that allows coding changes to be more easily accomplished, as well as similar advantages discussed above in relation to the embodiment of the present invention in FIG. 2.

As explained above, an embodiment of the present invention shown in FIG. 2 achieves a bit cell having a reduced height compared to a conventional bit cell, which results in increased speed, decreased size, decreased parasitic capacitance, and increased manufacturing yield. Also, an embodiment of the present invention in FIG. 3 achieves a bit cell having wider ground bus while maintaining a substantially similar size as a conventional bit cell, which results in increased speed and improved manufacturing robustness.

From the description of the above invention it is evident that various techniques can be used for implementing the concepts of the present invention without departing from its scope and spirit. Moreover, while the invention has been described with specific reference to certain embodiments, a person of ordinary skills in the art would recognize that changes made in form and detail without departing from the spirit and scope of the invention. The described embodiments are to be considered in all respects as illustrative and not restrictive. Therefore, it should be understood that the invention is not limited to the particular embodiments described herein, but is capable of many rearrangements, modifications, and substitutions without departing from the scope of the invention.

Thus, bit cells having offset contacts in a memory array have been described.

What is claimed is:

1. A semiconductor device including a ROM array, said semiconductor device comprising:
   a first active line and a second active line situated on a substrate, said first active line being substantially parallel to said second active line;
   a bit cell situated between said first active line and said second active line, said bit cell being situated in said ROM array;
   a first active segment coupled to said first active line, said first active segment being situated in said bit cell;
   a first word line and a second word line, said first word line being situated over said first active segment, said first word line being substantially parallel to said second word line;
   a column situated over said first active segment, said first word line and said second word line;
   a first contact situated on said first active segment, said first contact coupling said first active segment and said column, said first contact being situated a first distance from said first word line and a second distance from said second word line;
   wherein said first distance is less than said second distance.

2. The semiconductor device of claim 1 wherein said first active line and said second active line define a pitch, said pitch being determined by a height of said bit cell.

3. The semiconductor device of claim 1 wherein said first distance is substantially equal to a minimum design rule separation distance.

4. The semiconductor device of claim 1 wherein said first active segment overlaps said first contact by a third distance, said third distance being substantially equal to a minimum design rule separation distance.

5. The semiconductor device of claim 1 wherein said second word line is situated a third distance from said first active segment, said third distance being substantially equal to a minimum design rule separation distance.

6. The semiconductor device of claim 1 wherein said bit cell comprises a transistor, said transistor being situated at an intersection of said first active segment and said first word line.

7. The semiconductor device of claim 1 wherein a width of said first active line is greater than a minimum design rule width.

8. The semiconductor device of claim 1 wherein said width of said first active line is substantially equal to a minimum design rule width.

9. The semiconductor device of claim 6 wherein said transistor comprises a drain region, said drain region being connected to said column by said first contact.

10. The semiconductor device of claim 1 wherein said first active line comprises a ground bus.

11. The semiconductor device of claim 1 further comprising a second contact situated on a second active segment, said second contact being situated a third distance from said first word line and said second word line, said second active segment overlapping said first word line.

12. The semiconductor device of claim 1 further comprising a second contact situated on a second active segment, said second active segment having a first width in an x-direction and a second width in a y-direction, said first width being greater than said second width.

13. The semiconductor device of claim 12 wherein said first active segment overlaps said first contact by a third distance in said x-direction, said third distance being less than a minimum design rule overlap distance.

14. A semiconductor device including a ROM array, said semiconductor device comprising:
   a first active line and a second active line situated on a substrate, said first active line being substantially parallel to said second active line;
   a bit cell situated between said first active line and said second active line, said bit cell being situated in said ROM array;
   an active segment coupled to said first active line, said active segment being situated in said bit cell;
   a first word line and a second word line, said first word line being situated over said active segment, said first word line being substantially parallel to said second word line;
   a column situated over said active segment, said first word line and said second word line;
   a contact situated on said active segment, said contact coupling said active segment and said column, said contact being situated a first distance from said first word line and said second word line, said active segment overlapping said contact by a second distance, said first distance being greater than said second distance;
   wherein said second distance is less than a minimum design rule overlap distance.

15. A semiconductor data array comprising:
   an active segment situated on a substrate;
   a first word line situated over said active segment;
   a second word line situated substantially parallel to said first word line, said second word line not being situated over said active segment;
   a column situated over said active segment, said first word line, and said second word line;
   a contact situated on said active segment, said contact coupling said active segment and said column, said contact being separated from said first word line by a first distance and from said second word line by a second distance;
   wherein said first distance is less than said second distance, and wherein said first distance is a minimum design rule separation distance.

16. A semiconductor data array comprising:
   an active segment situated on a substrate;
   a first word line situated over said active segment;
   a second word line situated substantially parallel to said first word line, said second word line not being situated over said active segment;
   a column situated over said active segment, said first word line, and said second word line;
   a contact situated on said active segment, said contact coupling said active segment and said column, said contact being separated from said first word line by a first distance and from said second word line by a second distance;
   wherein said first distance is less than said second distance, and wherein said second word line is situated a third distance from said active segment, said third distance being substantially equal to a minimum design rule separation distance.

17. A semiconductor data array comprising:
   an active segment situated on a substrate;
   a first word line situated over said active segment;
   a second word line situated substantially parallel to said first word line, said second word line not being situated over said active segment;
   a column situated-over said active segment, said first word line, and said second word line;
   a contact situated on said active segment, said contact coupling said active segment and said column, said contact being separated from said first word line by a first distance and from said second word line by a second distance;
   wherein said first distance is less than said second distance, and wherein said active segment overlaps said contact by a third distance, said third distance being substantially equal to a minimum design rule separation distance.

18. A semiconductor data array comprising:
   an active segment situated on a substrate;
   a first word line situated over said active segment;
   a second word line situated substantially parallel to said first word line, said second word line not being situated over said active segment;
   a column situated over said active segment, said first word line, and said second word line;
   a contact situated on said active segment, said contact coupling said active segment and said column, said contact being separated from said first word line by a first distance and from said second word line by a second distance:
   wherein said first distance is less than said second distance, and wherein said contact is situated in a bit cell, said bit cell having a height substantially equal to a minimum design rule height.

19. A semiconductor data array comprising:
   an active segment situated on a substrate;
   a first word line situated over said active segment;

a second word line situated substantially parallel to said first word line, said second word line not being situated over said active segment;

a column situated over said active segment, said first word line, and said second word line;

a contact situated on said active segment, said contact coupling said active segment and said column, said contact being separated from said first word line by a first distance and from said second word line by a second distance, wherein said first distance is less than said second distance;

said semiconductor data array further comprising an active line, said active line being situated substantially parallel to said first word line, said active line being connected to said active segment, and wherein said active line has a width substantially equal to a minimum design rule width.

20. A semiconductor data array comprising:

an active segment situated on a substrate;

a first word line situated over said active segment;

a second word line situated substantially parallel to said first word line, said second word line not being situated over said active segment;

a column situated over said active segment, said first word line, and said second word line;

a contact situated on said active segment, said contact coupling said active segment and said column, said contact being separated from said first word line by a first distance and from said second word line by a second distance, wherein said first distance is less than said second distance;

said semiconductor data array further comprising an active line, said active line being situated substantially parallel to said first word line, said active line being connected to said active segment, and wherein said active line has a width greater than a minimum design rule width.

* * * * *